United States Patent
Wang et al.

(10) Patent No.: US 10,276,540 B2
(45) Date of Patent: Apr. 30, 2019

(54) CHIP PACKAGING METHOD AND CHIP PACKAGING STRUCTURE

(71) Applicant: China Wafer Level CSP Co., Ltd., Suzhou, Jiangsu (CN)

(72) Inventors: Zhiqi Wang, Suzhou (CN); Ying Yang, Suzhou (CN); Wei Wang, Suzhou (CN)

(73) Assignee: China Wafer Level CSP Co., Ltd., Suzhou, Jiangsu (CN)

( * ) Notice: Subject to any disclaimer, the term of this patent is extended or adjusted under 35 U.S.C. 154(b) by 0 days.

(21) Appl. No.: 15/558,341

(22) PCT Filed: Oct. 23, 2015

(86) PCT No.: PCT/CN2015/092614
§ 371 (c)(1),
(2) Date: Sep. 14, 2017

(87) PCT Pub. No.: WO2016/145852
PCT Pub. Date: Sep. 22, 2016

(65) Prior Publication Data
US 2018/0068977 A1 Mar. 8, 2018

(30) Foreign Application Priority Data
Mar. 16, 2015 (CN) .......................... 2015 1 0114089

(51) Int. Cl.
*H01L 21/56* (2006.01)
*H01L 23/00* (2006.01)
(Continued)

(52) U.S. Cl.
CPC ............ *H01L 24/97* (2013.01); *H01L 21/568* (2013.01); *H01L 23/488* (2013.01); *H01L 24/01* (2013.01);
(Continued)

(58) Field of Classification Search
CPC ......... H01L 24/97; H01L 24/01; H01L 24/19; H01L 24/20; H01L 24/24; H01L 24/82;
(Continued)

(56) References Cited

U.S. PATENT DOCUMENTS 8,895,440 B2 * 11/2014 Choi ..................... H01L 21/561
438/113
2006/0043600 A1 3/2006 Onodera et al.
(Continued)

FOREIGN PATENT DOCUMENTS

CN 1438684 A 8/2003
CN 101789420 A 7/2010
(Continued)

OTHER PUBLICATIONS

Chinese Office Communication for Application No. CN 201510114089.9 dated Apr. 19, 2018.
(Continued)

*Primary Examiner* — Jasmine J Clark
(74) *Attorney, Agent, or Firm* — Wolf, Greenfield & Sacks, P.C.

(57) ABSTRACT

A packaging method and a packaging structure are provided. The method includes: providing a first substrate and a second substrate, the second substrate having a fist surface and a second surface opposite to each other, a side surface of the first substrate being adhered to the first surface of the second substrate via an adhesive layer; forming a groove structure on the second surface of the second substrate; providing a base, the base having a first surface and a second surface opposite to each other, the first surface of the base including a sensing region and multiple bonding pads around the sensing region; and laminating the second surface of the second substrate with the first surface of the base
(Continued)

to form a cavity between the groove structure and the base, such that the sensing region is located in the cavity.

17 Claims, 10 Drawing Sheets

(51) Int. Cl.
  *H01L 23/488* (2006.01)
  *H01L 25/065* (2006.01)
(52) U.S. Cl.
  CPC .............. *H01L 24/19* (2013.01); *H01L 24/20* (2013.01); *H01L 24/24* (2013.01); *H01L 24/82* (2013.01); *H01L 2224/04105* (2013.01); *H01L 2224/12105* (2013.01); *H01L 2224/16227* (2013.01); *H01L 2224/24145* (2013.01); *H01L 2224/24146* (2013.01); *H01L 2224/24153* (2013.01); *H01L 2224/24195* (2013.01); *H01L 2224/32145* (2013.01); *H01L 2224/32225* (2013.01); *H01L 2224/32227* (2013.01); *H01L 2224/73267* (2013.01); *H01L 2224/8203* (2013.01); *H01L 2224/82005* (2013.01); *H01L 2224/92244* (2013.01); *H01L 2224/97* (2013.01); *H01L 2924/15174* (2013.01); *H01L 2924/15313* (2013.01); *H01L 2924/18162* (2013.01); *H01L 2924/19105* (2013.01)
(58) Field of Classification Search
  CPC . H01L 21/568; H01L 23/488; H01L 25/0657; H01L 2924/14; H01L 2224/16145; H01L 2224/11; H01L 2225/06541; H01L 2225/1058; H01L 25/043; H01L 2224/24145; H01L 2224/97; H01L 21/563; H01L 2224/73267; H01L 2224/92244; H01L 2224/32225
  USPC .................................. 257/777, 690; 438/109
  See application file for complete search history.

(56) References Cited

U.S. PATENT DOCUMENTS

| | | | |
|---|---|---|---|
| 2008/0026506 | A1 | 1/2008 | Kim et al. |
| 2012/0292788 | A1 | 11/2012 | Choi |
| 2014/0001612 | A1 | 1/2014 | Yu et al. |
| 2015/0041975 | A1* | 2/2015 | Chung .................. H01L 25/105 257/737 |
| 2015/0200153 | A1 | 7/2015 | Wang et al. |
| 2015/0364457 | A1* | 12/2015 | Chen ....................... H01L 25/50 257/686 |
| 2017/0084555 | A1* | 3/2017 | Yu ......................... H01L 23/3114 |

FOREIGN PATENT DOCUMENTS

| | | |
|---|---|---|
| CN | 102122624 A | 7/2011 |
| CN | 103515344 A | 1/2014 |
| CN | 103730379 A | 4/2014 |
| CN | 104835808 A | 8/2015 |
| JP | 2004-312008 A | 11/2004 |

OTHER PUBLICATIONS

International Search Report for International Application No. PCT/CN2015/092614 dated Feb. 2, 2016.

* cited by examiner

CHIP PACKAGING METHOD AND CHIP PACKAGING STRUCTURE

This application is the National Stage application of PCT international patent application PCT/CN 2015/092614 filed on Oct. 23, 2015 which claims priority to Chinese Patent Application No. 201510114089.9, titled "CHIP PACKAGING METHOD AND CHIP PACKAGING STRUCTURE", filed with the Chinese State Intellectual Property Office on Mar. 16, 2015, both of which are incorporated herein by reference in their entireties.

FIELD

The present disclosure relates to the technical field of semiconductor fabrication, and particularly to a chip packaging method and a chip packaging structure.

BACKGROUND

The Wafer Level Chip Size Packaging (WLCSP) technology is a technology in which a packaging test is performed on a wafer and then the wafer is cut to obtain a single chip finished product, and a size of the packaged chip is totally the same as that of a die. The wafer level chip size packaging technology totally subverts the conventional package, such as Ceramic Leadless Chip Carrier and Organic Leadless Chip Carrier and the like, and meets market requirements of being lighter, smaller, shorter, thinner and cheaper for microelectronic products. A size of the chip packaged with the wafer level chip size packaging technology can be highly miniaturized, and a chip cost is decreased significantly with decrease of the chip size and increase of the wafer size. The wafer level chip size packaging technology is a technology that may integrate the IC design, the wafer fabrication, the package test and the substrate fabrication, which is a hot topic and represents a future development trend in the current package field.

The fan out wafer level packaging technology is one of the wafer level packaging technologies. The fan out wafer level packaging method includes: forming a peeling film on a surface of a carrier wafer; forming a dielectric layer on a surface of the peeling film; forming a re-wiring metal layer and a metal electrode in the dielectric layer; flipping the chip to electrically connect to the metal electrode; forming a plastic packaging material layer on a surface of the dielectric layer and a surface of the chip after the chip is flipped, where the plastic packaging material layer encloses the chip to form a packaging structure with the plastic packaging material layer; separating the carrier wafer and the peeling film from the packaging structure with the plastic packaging material layer, to form a plastic package wafer; soldering balls and reflowing to form solder ball bumps on a surface of the exposed metal electrode; and cutting in a monolithic manner to form a final fan out chip structure.

Practically, a package quality of the conventional fan out wafer level packaging method and an integration level of the formed packaging structure are to be improved.

SUMMARY

An object of the present disclosure is to provide a chip packaging method and a chip packaging structure, so that a size of the formed packaging structure is shrunk, and the stability and the reliability of the formed packaging structure are improved.

In order to solve the above problem, a chip packaging method is provided according to the present disclosure, which includes:

providing a first chip, where the first chip includes a first surface and a second surface opposite to each other and there are multiple first contact pads on the first surface of the first chip;

providing a second chip, where the second chip includes a third surface and a fourth surface opposite to each other, there are multiple second contact pads on the third surface of the second chip, and an area of the second chip is greater than an area of the first chip;

providing a substrate holder;

bonding the fourth surface of the second chip with a surface of the substrate holder;

bonding the second surface of the first chip with the third surface of the second chip, where the multiple second contact pads are located outside a region where the first chip and the second chip are bonded;

forming a material sealing layer on the surface of the substrate holder, where the material sealing layer clads the first chip and the second chip; and forming first electrical interconnections and second electrical interconnections in the material sealing layer, where the first electrical interconnections are electrically connected to the first contact pads, and the second electrical interconnections are electrically connected to the second contact pads.

Optionally, the bonding the fourth surface of the second chip with the surface of the substrate holder may include: forming a bonding layer on the surface of the substrate holder; and fixing the fourth surface of the second chip on a surface of the bonding layer.

Optionally, the second surface of the first chip may be bonded with the third surface of the second chip through an insulating adhesive layer.

Optionally, the material sealing layer may be a photosensitive dry film, a non-photosensitive dry film or a plastic packaging material film.

Optionally, the method may further include: forming multiple first openings through which multiple first contact pads are exposed respectively in the material sealing layer; and forming multiple second openings through which multiple second contact pads are exposed respectively in the material sealing layer.

Optionally, the first electrical interconnections and the second electrical interconnections may include: electrical interconnection layers located on sidewalls and bottom surfaces of the first openings, sidewalls and bottom surfaces of the second openings and a part of a top surface of the material sealing layer, and the electrical interconnection layers fill fully or do not fill fully the first openings or the second openings.

Optionally, the method may further include: forming solder masks on surfaces of the material sealing layer and the electrical interconnection layers, where the solder masks have multiple third openings through which a part of the surfaces of the electrical interconnection layers is exposed; and forming bumps in the third openings.

Optionally, after the forming the material sealing layer, the method may further include: removing the substrate holder to form a substrate to be processed; and cutting the substrate to be processed to form multiple independent packaging structures. The packaging structures include the first chip and the second chip bonded with each other, and the material sealing layer cladding the first chip and the second chip.

Optionally, the number of the first chips may be one or more; and the number of the second chips may be one or more.

Optionally, in a case that the number of the first chips is more than one, multiple first chips may be located in a same layer or located on multiple overlapping layers, and the multiple first chips may be distributed on one or more of the second chips; and in a case that the number of the first chips or the second chips is more than one, functions of the multiple first chips or second chips may be same or different.

Accordingly, a chip packaging structure formed by adopting any method described above is further provided according to the present disclosure, which includes:

a first chip, where the first chip includes a first surface and a second surface opposite to each other and there are multiple first contact pads on the first surface of the first chip;

a second chip, where the second chip includes a third surface and a fourth surface opposite to each other, there are multiple second contact pads on the third surface of the second chip, and an area of the second chip is greater than an area of the first chip;

a substrate holder, where the fourth surface of the second chip is bonded with a surface of the substrate holder, and where the second surface of the first chip is bonded with the third surface of the second chip, and the multiple second contact pads are located outside a region where the first chip and the second chip are bonded;

a material sealing layer located on the surface of the substrate holder, where the material sealing layer clads the first chip and the second chip; and first electrical interconnections and second electrical interconnections located in the material sealing layer, where the first electrical interconnections are electrically connected to the first contact pads, and the second electrical interconnections are electrically connected to the second contact pads.

As compared with the conventional technology, the technical solution of the present disclosure has the following advantages.

In the method of the present disclosure, the first chip and the second chip are provided, and the area of the first chip is less than the area of the second chip. There are the second contact pads on the third surface of the second chip and there are the first contact pads on the first surface of the first chip; the fourth surface of the second chip is bonded with the surface of the substrate holder, the second contact pads can be exposed; the second surface of the first chip is bonded with the third surface of the second chip and the multiple second contact pads are located outside the region where the first chip and the second chip are bonded, so that both the first contact pad and the second contact pad can be exposed. Therefore, the material sealing layer cladding both the first chip and the second chip can be formed on the substrate holder directly.

Firstly, the fourth surface of the second chip is bonded with the surface of the substrate holder and the second surface of the first chip is bonded with the third surface of the second chip, so that the first chip and the second chip are bonded with each other more stably, and a distance between the first chip and the second chip is decreased, thereby being beneficial to shrink a size of the packaging structure.

Secondly, since the material sealing layer clads both the first chip and the second chip, a thickness requirement for the first chip or the second chip is reduced, the thickness of the first chip can be further decreased, thereby being beneficial to decrease a total thickness of the first chip and the second chip, and thus reducing a size of the formed packaging structure. Besides, the stability of the material sealing layer is better, thereby solving the cracking or peeling problem caused in a case of forming a multilayer material sealing layer.

Lastly, after the material sealing layer is formed, the first electrical interconnections electrically connected to the first contact pads and the second electrical interconnections electrically connected to the second contact pads are formed. The process steps of forming multilayer electrical interconnections by multiple times are avoided, so that the forming process of the first electrical interconnections and the second electrical interconnections is simplified, and an alignment deviation problem generated during the process of forming the multilayer electrical interconnections is solved. And, since the thickness requirement for the first chip and the second chip is reduced, a distance from the plastic packaging layer to the second contact pad is decreased by decreasing the thickness of the first chip, so that difficulty of a process for forming the second electrical interconnections is reduced, and it is beneficial to reduce a possibility that an open circuit occurs between the second electrical interconnections and the second contact pads, and between the first electrical interconnections and the first contact pads, thereby improving a yield of the formed packaging structure.

Furthermore, the fourth surface of the second chip is bonded with the surface of the substrate holder through the bonding layer and the second surface of the first chip is bonded with the third surface of the second chip through the insulating adhesive layer, so that it is beneficial to bond the first chip with the second chip more stably, and a distance from the second surface of the first chip to the third surface of the second chip can be decreased, thereby being beneficial to shrink the size of the formed packaging structure.

In the structure of the present disclosure, there are the second contact pads on the third surface of the second chip and there are the first contact pads on the first surface of the first chip; the fourth surface of the second chip is bonded with the surface of the substrate holder, and the second surface of the first chip is bonded with the third surface of the second chip, and the multiple second contact pads are located outside the region where the first chip and the second chip are bonded, so that both the first contact pad and the second contact pad can be exposed. Therefore, the material sealing layer can clad the first chip and the second chip directly. Firstly, the first chip and the second chip are bonded with each other more stably, and the distance between the first chip and the second chip is decreased, and it is beneficial to shrink the size of the packaging structure. Secondly, the material sealing layer clads both the first chip and the second chip, the thickness requirement for the first chip and the second chip is reduced, and the thickness of the first chip and the second chip can be decreased; furthermore, the stability of the material sealing layer is better, thereby solving the cracking or peeling problem caused in a case of forming the multilayer material sealing layer. Lastly, the material sealing layer has the first electrical interconnections electrically connected to the first contact pads and the second electrical interconnections electrically connected to the second contact pads, the alignment deviation problem of the multilayer electrical interconnections is solved, thereby being beneficial to reduce a possibility of an open circuit, and improving a yield of the packaging structure.

DETAILED DESCRIPTION OF THE EMBODIMENTS

As described in the background, a package quality of the existing fan out wafer level packaging method and an integration level of the formed packaging structure are to be improved.

Figure 1:
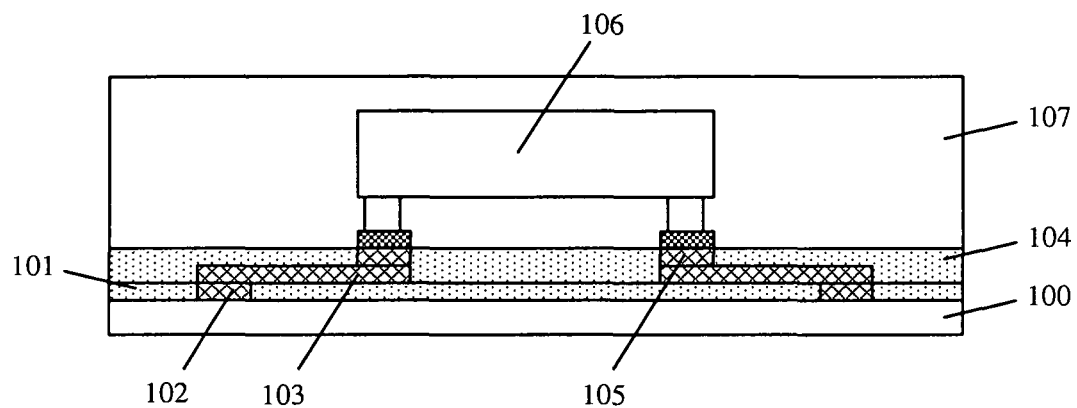
FIG. 1 is a fan out wafer level packaging structure according to the conventional technology for the present disclosure.

Reference is made to FIG. 1, which is a fan out wafer level packaging structure according to the conventional technology. The packaging structure includes: a substrate holder 100; a peeling film and a first dielectric layer 101 located on a surface of the substrate holder 100; first openings located in the first dielectric layer 101; substrate end metal electrodes 102 located in the first openings; a wiring layer 103 located on a surface of the first dielectric layer 101; a second dielectric layer 104 located on surfaces of the wiring layer 103, the substrate end metal electrode 102 and the first dielectric layer 101, where the second dielectric layer 104 has second openings; chip end metal electrodes 105 located in the second openings; a chip 106, where a functional surface of the chip 106 is flipped on the second dielectric layer 104, and the chip 106 is electrically connected to the chip end metal electrodes 105; and a plastic packaging layer 107 located on a surface of the second dielectric layer 104, where the plastic packaging layer 107 encloses the chip 106, thereby forming a packaging structure.

The substrate holder 100 in the packaging structure is to be removed subsequently, and a solder ball is formed on a surface through which the substrate end metal electrode 102 is exposed, the solder ball is electrically connected to the substrate end metal electrode 102; monolithic cutting is performed on the packaging structure to form a fan out chip packaging structure.

In the fan out chip packaging structure formed above, the chip 106 is a single function chip. In a case that a multi-functional system is to be formed, multiple fan out chip packaging structures with different functions are to be integrated, resulting in a large size of a formed package device and a high manufacturing cost.

Figure 2:
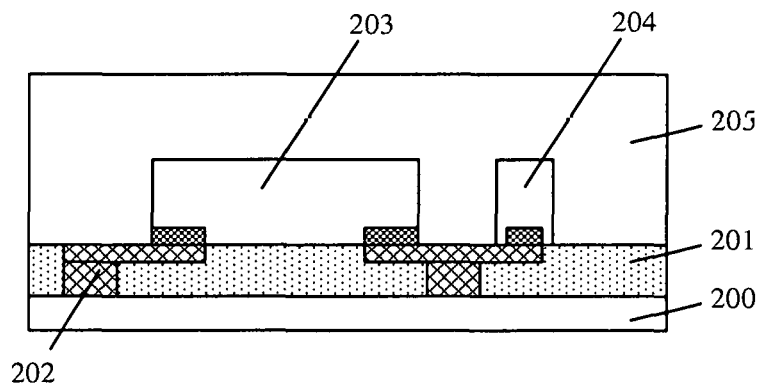
FIG. 2 is a system level fan out wafer packaging structure according to the conventional technology for the present disclosure.

In order to satisfy a requirement of the micro-miniaturization of a semiconductor device, another system level fan out wafer packaging structure is provided according to the conventional technology. As shown in FIG. 2, the packaging structure includes: a substrate holder 200; a dielectric layer 201 located on a surface of the substrate holder 200; an electrical interconnection structure 202 located in the dielectric layer 201; an active chip 203 and a passive chip 204, where functional surfaces of the active chip 203 and the passive chip 204 are flipped on the dielectric layer 201, and the active chip 203 and the passive chip 204 are electrically connected to the electrical interconnection structure 202; a plastic package layer 205 located on a surface of the dielectric layer 201, where the plastic package layer 205 encloses the passive chip 204 and the active chip 203. After the substrate holder 200 is removed subsequently, a solder ball is formed on a surface of the exposed electrical interconnection structure, and the formed structure is cut to form a chip packaging structure including the active chip 203 and the passive chip 204.

In the formed packaging structure above, both the active chip 203 and the passive chip 204 are flipped on the substrate holder 200, resulting in that a size of the system level packaging structure is still large, therefore a size of the fan out wafer level packaging structure is to be reduced.

Figure 3:
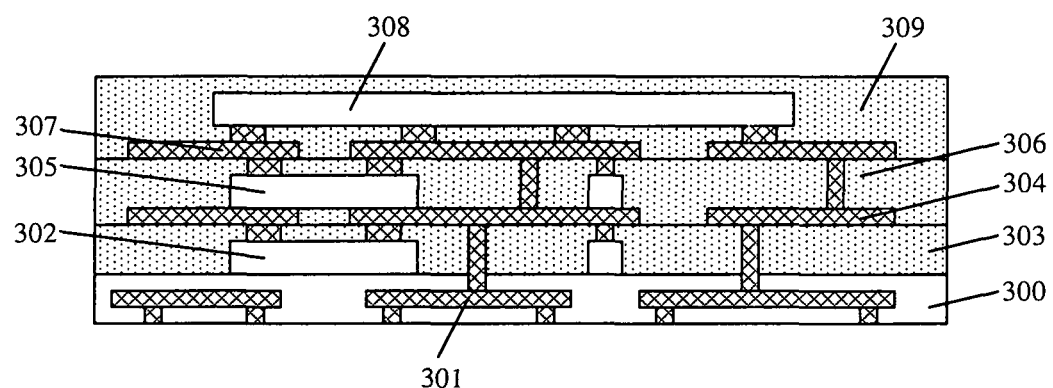
FIG. 3 is another system level fan out wafer packaging structure according to the conventional technology for the present disclosure.

According to another conventional technology, a fan out wafer packaging structure is further provided. As shown in FIG. 3, the packaging structure includes: a dielectric layer 300; a re-wiring layer 301 located in the dielectric layer 300; a first chipset 302, where nonfunctional surfaces of the first chipset 302 are fixed on a surface of the dielectric layer 300, and the first chipset 302 includes an active chip and a passive chip; a first plastic package layer 303 located on the surface of the dielectric layer 300, where the first plastic package layer 303 encloses the first chipset 302; a first electrical interconnection structure 304 located on a surface and in interior of the first plastic package layer 303, where the first electrical interconnection structure 304 is electrically connected to the re-wiring layer 301 and the first chipset 302; a second chipset 305, where nonfunctional surfaces of the second chipset 305 are fixed on surfaces of the first plastic package layer 303 and the first electrical interconnection structure 304, where the second chipset 305 includes an active chip and a passive chip; a second plastic package layer 306 located on the surfaces of the first plastic package layer 303 and the first electrical interconnection structure 304, where the second plastic package layer 306 encloses the second chipset 305; a second electrical interconnection structure 307 located on a surface and in interior of the second plastic package layer 306, where the second electrical interconnection structure 307 is electrically connected to the first electrical interconnection structure 304 and the second chipset 305; a third chipset 308, where functional surfaces of the third chipset 308 are flipped on the second plastic package layer 306 and the second electrical interconnection structure 307, the third chipset 308 is electrically connected to the second electrical interconnection structure 307, and the third chipset 308 includes an active chip and a passive chip; and a third plastic package layer 309 located on surfaces of the second plastic package layer 306 and the second electrical interconnection structure 307, where the third plastic package layer 309 encloses the third chipset 308.

With the fan out wafer packaging structure, multiple chipsets can be arranged to overlap with each other. However, once one chipset is formed, one plastic package layer is to be formed to enclose the chipset; in addition, an electrical interconnection structure is to be formed on a surface and in interior of each plastic package layer, to realize electrical connection between electrical interconnection structures in different layers. Therefore, a fabrication process of the packaging structure is complex and a cost of the packaging structure is high.

Secondly, the chipset in each layer is to be enclosed and fixed by one plastic package layer. In order to satisfy requirements of the plastic package process, the chipset in each layer is not suitable to be too thin, that is, the passive chip and the active chip in the chipset in each layer are not suitable to be too thin; otherwise, it results in that the formed plastic package layer material cannot enclose the chipset completely, and even the plastic package layer cannot be formed. Therefore, even though the chipsets can be arranged to overlap with each other, the thickness of the formed packaging structure is still great. Therefore, a space occupancy rate of the formed packaging structure is still high, thereby being not beneficial to meet the requirement of micro-miniaturization of the device.

Moreover, the chipset and the plastic package layer in each layer are thick, thus, a through hole for forming a conductive plug is deep, resulting in increase of difficulty of a process for forming the through hole. In addition, the electrical interconnection structure is to be formed on a surface and in interior of the plastic package layer in each layer, thereby resulting in increase of an alignment difficulty of the electrical interconnection structures and yield loss between the electrical interconnection structures in different layers.

Lastly, since the chipset in each layer is to be enclosed and fixed by one plastic package layer, bonding stability between two adjacent plastic package layers is bad, cracking or peeling is susceptible to occur between two plastic package layers. Therefore, a defect is susceptible to appear in the interior of the formed packaging structure, and the stability of the packaging structure is bad and the reliability of the packaging structure is low.

In order to solve the problems above, a chip packaging method and a chip packaging structure are provided according to the present disclosure. In the packaging method, a first chip and a second chip are provided, and an area of the first chip is less than an area of the second chip. There is a second contact pad on a third surface of the second chip, there is a first contact pad on a first surface of the first chip; a fourth surface of the second chip is bonded with a surface of a substrate holder, the second contact pad can be exposed; a second surface of the first chip is bonded with the third surface of the second chip, and multiple second contact pads are located outside the region where the first chip and the second chip are bonded, so that both the first contact pad and the second contact pad can be exposed. Therefore, a material sealing layer cladding both the first chip and the second chip can be formed on the surface of the substrate holder directly. Firstly, the fourth surface of the second chip is bonded with the surface of the substrate holder and the second surface of the first chip is bonded with the third surface of the second chip, so that the first chip and the second chip are bonded with each other more stably, and a distance between the first chip and the second chip is decreased, thereby being beneficial to shrink a size of the packaging structure. Besides, the stability of the material sealing layer is better, thereby solving the cracking or peeling problem caused in a case of forming a multilayer material sealing layer. Secondly, after the material sealing layer is formed, the first electrical interconnections electrically connected to the first contact pads and the second electrical interconnections electrically connected to the second contact pads are formed. The process steps of forming multilayer electrical interconnections by multiple times are avoided, so that forming processes of the first electrical interconnections and the second electrical interconnections are simplified, and an alignment deviation problem during the process of forming the multilayer electrical interconnections is solved. And, a distance between the first surface of the first chip and the third surface of the second chip is minimized, i.e., decreasing a distance from the plastic package layer to the second contact pad, thus difficulty of a process for forming the second electrical interconnections is reduced, thereby being beneficial to reduce a possibility that an open circuit occurs between the second electrical interconnections and the second contact pads and between the first electrical interconnections and the first contact pads, and improving a yield of the formed packaging structure.

In order to make the objects, features and advantages of the present disclosure descried above more obvious and be understood more easily, specific embodiments of the present disclosure are described in detail in conjunction with the accompanying drawings in the following.

FIGS. 4 to 17 are schematic cross-section structural diagrams of a chip packaging process according to an embodiment of the present disclosure.

Figure 4:
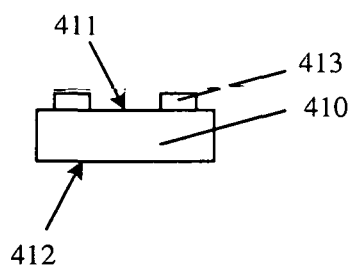
FIGS. 4 to 17 are schematic cross-section structural diagrams of a chip package process according to an embodiment of the present disclosure.

Reference is made to FIG. 4, and a first chip 410 is provided. The first chip 410 includes a first surface 411 and a second surface 412 opposite to each other, and there are multiple first contact pads 413 on the first surface 411 of the first chip 410.

In the embodiment, an area of the first chip 410 is less than an area of a second chip described later. The first chip 410 is bonded with the second chip. There is a first contact pad 413 on the first surface of the first chip 410, the first surface 411 of the first chip 410 is a functional surface, and the second surface 412 of the first chip 410 is a nonfunctional surface. The second surface 412 of the first chip 410 is bonded with the second chip later, and the first contact pad 413 of the first chip 410 can be exposed, so that first electrical interconnections electrically connected to the first contact pads 413 can be formed subsequently.

Figure 5:
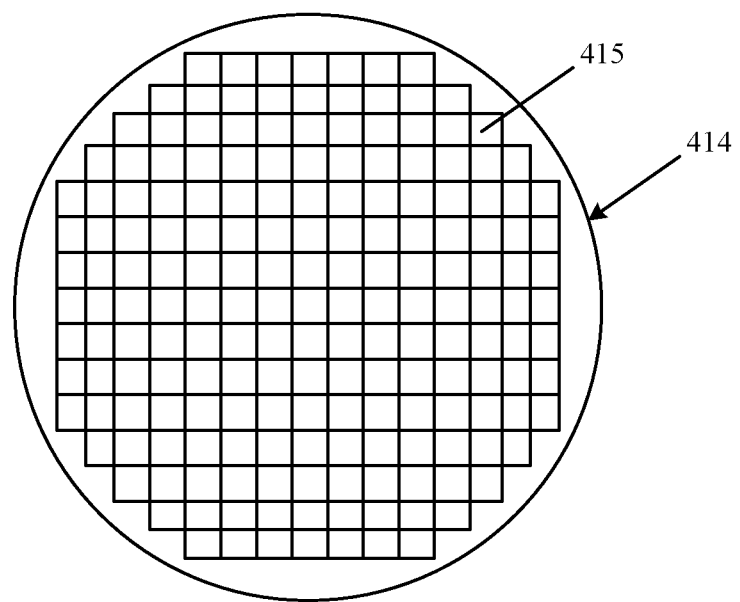

Steps of forming the first chip 410 includes: providing a first substrate 414 (as shown in FIG. 5), which includes multiple first chip regions 415; thinning and cutting the first substrate 414, so that the multiple first chip regions 415 are independent from each other to form the first chip 410.

The first substrate 414 may be a silicon substrate, a silicon germanium substrate, a silicon carbide substrate, a silicon-on-insulator (SOI) substrate, a germanium-on-insulator (GOI) substrate, a silicon substrate, a silicon germanium substrate, a silicon carbide substrate, a silicon-on-insulator (SOI) substrate or a germanium-on-insulator (GOI) substrate. The first substrate 414 is a whole wafer.

The first chip 410 is formed by the first chip regions 415. In the embodiment, the first chip regions 415 are arranged in an array. In the embodiment, first cutting channel regions are provided between the adjacent first chip regions 415. The first substrate 414 is cut in the first cutting channel regions, so that multiple first chip regions 415 are separated and independent from each other to form the first chip 410.

Semiconductor devices, an electrical interconnection structure for electrically interconnecting the semiconductor devices and an insulating layer for electrically isolating the semiconductor devices from the electrical interconnection structure are formed in the first chip region 415 of the first substrate 414. The formed first chip 410 may include an integrated circuit chip, a sensor chip or a Micro-electromechanical System (MEMS) chip. The integrated circuit chip may include a processor chip, a memory chip or a controller chip. The sensor chip may include an image sensor chip, such as a CCD image sensor or a CMOS image sensor. The sensor chip may further include a temperature sensor chip, a pressure sensor chip, a humidity sensor chip or a motion sensor chip, which is not limited in the present disclosure.

The first contact pad 413 is located on the first surface 411 of the first chip 410. In the embodiment, the first contact pad 413 is located in an edge region of the first surface 411, so that the first contact pad 413 can be exposed outside the region where the first chip and the second chip are bonded after the first surface 411 is bonded with the second chip subsequently. A material of the first contact pad 413 is a conductive material, the conductive material including copper, tungsten, aluminum, silver or gold. The first contact pad 413 is configured to realize electrical connection between the first chip 410 and other chips or circuits, and the first contact pad 413 can be electrically connected to the semiconductor device or the electrical interconnection structure required in the first chip 410. In the embodiment, the surface of the first contact pad 413 protrudes from the first surface 411. In other embodiment, the surface of the first contact pad 413 may be flush with the first surface 411.

Figure 6:
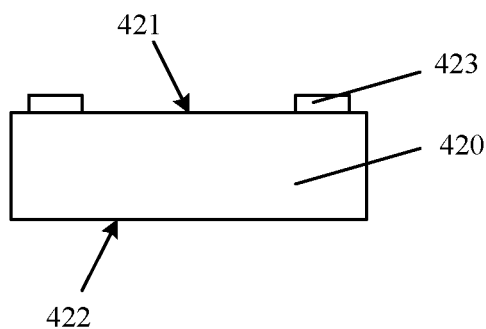

Reference is made to FIG. 6, and a second chip 420 is provided. The second chip 420 includes a third surface 421 and a fourth surface 422 opposite to each other. There are multiple second contact pads 423 on the third surface 421 of the second chip 420, and an area of the second chip 420 is greater than an area of the first chip 410 (as shown in FIG. 4).

There are the second contact pads 423 on the third surface 421 of the second chip 420, the third surface 421 of the second chip 420 is a functional surface, and the fourth surface 422 of the second chip 420 is a nonfunctional surface. In the embodiment, the area of the second chip 420 is greater than the area of the first chip 410 (as shown in FIG. 4), and the second contact pads 423 are located in an edge region of the third surface 421 of the second chip 420. After the second surface 412 (as shown in FIG. 4) of the first chip 410 (as shown in FIG. 4) is bonded with a central region of the third surface 421 of the second chip 420, the second contact pads 423 are located outside the region where the first chip 410 and the second chip 420 are bonded, so that the second contact pads 423 can be exposed.

Steps of forming the second chip 420 are the same as the steps of forming the first chip 410, a size of the second chip 420 differs from that of the first chip 410, and a function or a type of the second chip 420 is the same as or different from that of the first chip 410.

The second contact pads 423 are located on the third surface 421 of the second chip 420. A material of the second contact pad 423 is a conductive material, the conductive material including copper, tungsten, aluminum, silver or gold. The second contact pad 423 is configured to realize electrical connection between the second chip 420 and other chips or circuits, and the second contact pad 423 can be electrically connected to the semiconductor device or the electrical interconnection structure required in the second chip 420. In the embodiment, a surface of the second contact pad 423 protrudes from the third surface 421. In other embodiment, the surface of the second contact pad 423 may be flush with the second surface 421.

Figure 7:
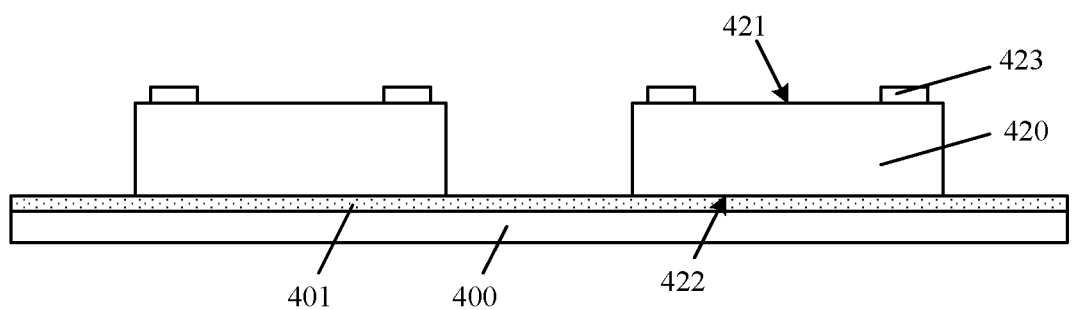

Reference is made to FIG. 7, and a substrate holder 400 is provided. The fourth surface 422 of the second chip 420 is bonded with a surface of the substrate holder 400.

The substrate holder 400 provides a work platform for forming a packaging structure subsequently. In the embodiment, the formed packaging structure is a system level fan out packaging structure. After the material sealing layer is formed subsequently, the substrate holder 400 is to be removed to form a packaging structure in which the first chip 410 (as shown in FIG. 4) and the second chip 420 are enclosed by the material sealing layer.

The substrate holder 400 includes a glass substrate, a semiconductor substrate or a resin substrate. In the embodiment, the substrate holder 400 is a silicon wafer or a glass substrate. The silicon wafer or the glass substrate is susceptible to be peeled, has high anti-corrosion capability, and may be reused.

Figure 8:
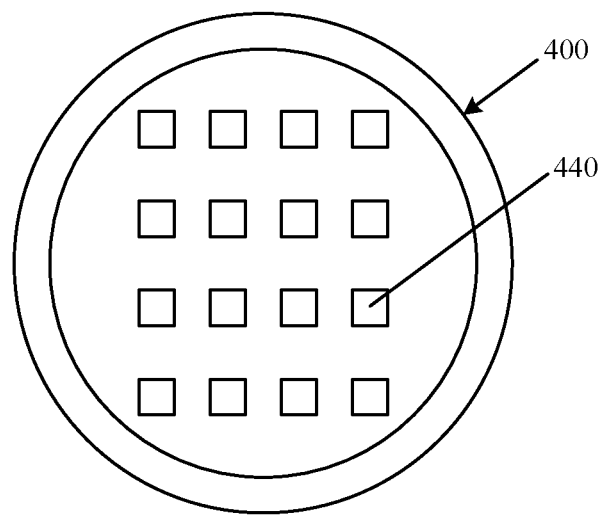

The substrate holder 400 in the embodiment is shown in FIG. 8, and the substrate holder 400 includes multiple device regions 440. The fourth surface 422 of the second chip 420 is bonded with surfaces of the device regions 440 of the substrate holder 400. A region between the adjacent device regions 440 functions as a cutting region. After the substrate holder 400 is removed subsequently, the formed packaging structure can be cut at positions corresponding to the cutting region to form a monolithic packaging structure.

In the embodiment, the second chip 420 is fixed on the surface of the substrate holder 400 through a bonding layer 401. Steps of bonding the fourth surface 422 of the second chip 420 with the surface of the substrate holder 400 include: forming the bonding layer 401 on the surface of the substrate holder 400; and fixing the fourth surface 422 of the second chip 420 on the surface of the bonding layer 401. Since there is no second contact pad 423 on the fourth surface 422 of the second chip 420, the second contact pad 423 can be exposed after the fourth surface 422 of the second chip 420 is bonded with the surface of the substrate holder 400.

The surface of the bonding layer 401 has viscosity, so that the substrate holder 400 and the second chip 420 are fixed mutually. Materials of the bonding layer 401 may include a UV glue. The viscosity of the UV glue is reduced after the UV glue is irradiated by ultraviolet light, so as to peel the substrate holder 400 from the packaging structure subsequently.

In other embodiment, a bonding layer may be formed on the fourth surface 422 of the second chip 420, and the fourth surface 422 of the second chip 420 is fixed on the surface of the substrate holder 400 through the bonding layer.

Figure 9:
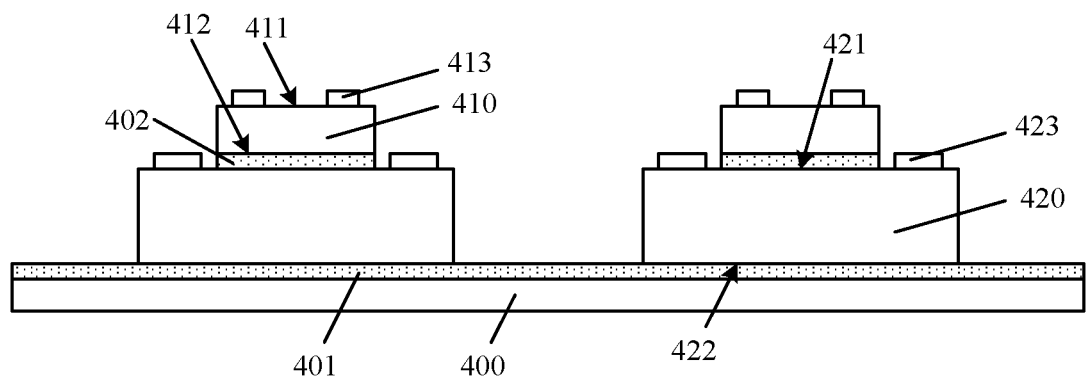

Reference is made to FIG. 9, the second surface 412 of the first chip 410 is bonded with the third surface 421 of the second chip 420, and the multiple second contact pads 423 are located outside the region where the first chip 410 and the second chip 420 are bonded.

The area of the first chip 410 is less than the area of the second chip 420, therefore a part of the third surface 421 of the second chip 420 can be exposed after the first chip 410 is fixed on the third surface 421 of the second chip 420. The second contact pad 423 in the embodiment is located in the edge region of the third surface 421 of the second chip 420, therefore the second contact pad 423 can be located outside the region where the first chip and the second chip are bonded after the first chip 410 is fixed on the central region of the third surface 421, so that the second contact pad 423 can be exposed.

Since there is the first contact pad 413 on the first surface 411 of the first chip 410, the first contact pad 413 can be exposed after the second surface 412 of the first chip 410 is fixed on the third surface 421 of the second chip 420.

Since both the first contact pad 413 and the second contact pad 423 can be exposed, a material sealing layer enclosing the first chip 410 and the second chip 420 can be formed directly later, and first electrical interconnections electrically connected to the first contact pads 413 and second electrical interconnections electrically connected to the second contact pads 423 can be formed simultaneously.

Firstly, it is not necessary to form material sealing layers enclosing the first chip 410 and the second chip 420 respectively, therefore not only the process can be simplified but also the cracking or peeling between the adjacent material sealing layers can be prevented. Thus, the material sealing layer formed subsequently has stable fixing capability and stable insulating protective capability, and the reliability of the formed packaging structure is improved.

Secondly, the thickness of the first chip 410 or the second chip 420 can be less than the thickness required by the plastic packaging process, so that the thickness of the formed first chip 410 or second chip 420 can be decreased accordingly, thereby being beneficial to decrease the thickness of the formed packaging structure and reducing difficulty of an etching process for forming the second electrical interconnections subsequently. In a case that plastic package is performed on a single chip, there is a thickness extreme value for a material sealing layer in each layer. But in the embodiment, after the first chip 410 is fitted with the second chip 420 through an insulating adhesive layer, and plastic package is performed on the first chip 410 and the second chip 420 as a whole, so that a size of the whole package structure is reduced.

In the embodiment, the second surface 412 of the first chip 410 is bonded with the third surface 421 of the second chip 420 by an insulating adhesive layer 402.

A surface of the insulating adhesive layer 402 has viscosity, so that the first chip 410 and the second chip 420 are fixed mutually. A material of the insulating adhesive layer 402 may include an insulating silicone, a polyimide or a BCB resin. The third surface 421 of the second chip 420 is fixed with the second surface 411 of the first chip 410 through the insulating adhesive layer, a distance between the third surface 421 and the second surface 411 can be decreased, thereby being further beneficial to decrease the thickness and the size of the formed packaging structure.

In the embodiment, the number of the first chips 410 is one. In another embodiment, the number of the first chips is more than one. In a case that the number of the first chips is more than one, functions of multiple first chips are same or different. In a case that the number of the first chips is more than one, multiple first chips are located in a same layer or form a multilayer overlapping structure. In a case that the first chips form the multilayer overlapping structure, a part of the first contact pads of the first chip in at least one layer are located outside a region where the first chips in two adjacent layers are bonded.

It should be noted that, in the embodiment and the accompanying drawing, only one first chip 410 and one second chip 420 are taken as examples to describe the chip packaging method and the chip packaging structure in the present disclosure. In other embodiment, the number of the first chips 410 may be one or more, and the number of the second chips 420 may be one or more. In a case that the number of the first chips or the number of the second chips is more than one, multiple first chips 410 or multiple second chips 420 are chips with the sane function or different functions, such as a memory chip, a processor chip, an image sensor chip or a motion sensor chip. In a case that the number of the first chips 410 is more than one, multiple first chips 410 may be distributed on the third surface 421 of one second chip 420.

Figure 10:
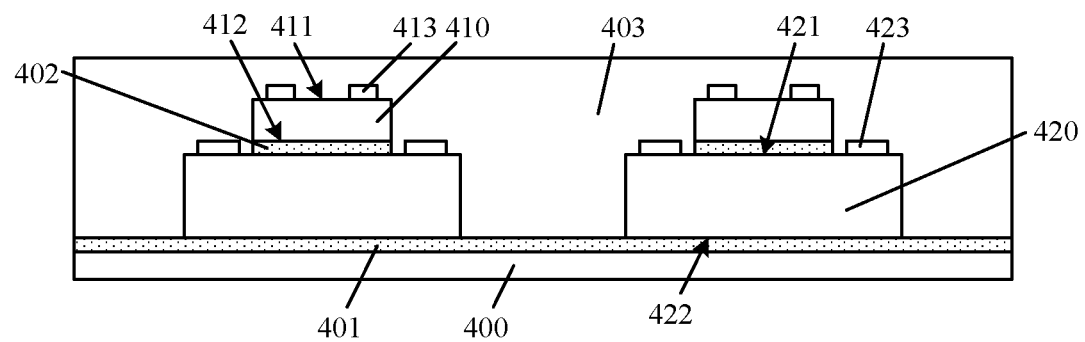

Reference is made to FIG. 10, a material sealing layer 403 is formed on the surface of the substrate holder 400, and the material sealing layer 403 clads the first chip 410 and the second chip 420.

In the embodiment, since both the second contact pad 423 and the first contact pad 413 can be exposed, the material sealing layer 403 can be formed after the first chip 410 and the second chip 420 are fixed mutually. Since steps of forming the material sealing layer enclosing the first chip 410 and the second chip 420 layer by layer respectively and forming a group of the electrical interconnection structure in each material sealing layer and on a surface of the material sealing layer are avoided, so that the process of forming the packaging structure can be simplified and it is beneficial to shrink the size of the formed packaging structure; in addition, the cracking or peeling problem between two material sealing layers caused in a case of forming the material sealing layer layer-by-layer can be solved.

Secondly, the thickness of the material sealing layer 403 is greater than the distance from the first surface 411 of the first chip 410 to the fourth surface 422 of the second chip 420, that is, the distance from the first surface 411 to the fourth surface 422 meets the forming process requirement of the material sealing layer 403, therefore the thickness of the first chip 410 and the second chip 420 can be decreased accordingly, thereby being beneficial to decrease the thickness and the size of the formed packaging structure.

Furthermore, the first electrical interconnections electrically connected to the first contact pad 413 and the second electrical interconnections electrically connected to the second contact pad 423 are formed simultaneously after the material sealing layer 403 is formed subsequently, so that not only the process steps are simplified, but also the alignment deviation problem caused by the electrical interconnections formed layer-by-layer can be solved, thereby preventing an open circuit between the electrical interconnections and improving the yield of the packaging structure.

The material sealing layer 403 may include a photosensitive dry film, a non-photosensitive dry film or a plastic packaging material film. In an embodiment, the material sealing layer 403 is the photosensitive dry film, and the material sealing layer 403 is formed by a vacuum film pasting process.

In another embodiment, a material of the material sealing layer 403 is a plastic package material. The plastic package material includes an epoxy resin, a polyimide resin, a benzocyclobutene resin, a polybenzimidazole resin, polybutylene terephthalate, polycarbonate, polyethylene glycol terephthalate, polyethylene, polypropylene, polyolefin, polyurethane, polyolefin, polyether sulfone, polyamide, polyurethane, ethylene-vinyl acetate copolymer, polyvinyl alcohol or other suitable polymeric materials.

The forming process of the material sealing layer 403 includes an injection molding process, a transfer molding process or a silk-screen printing process. The injection molding process includes: providing a mold; filling the mold with plastic packaging materials, so that the plastic packaging materials clad the first chip 410 and the second chip 420; and heating and curing the plastic packaging materials to form the material sealing layer 403.

In other embodiment, the material of the material sealing layer 403 may be other insulation materials, which is not limited in the present disclosure.

After the material sealing layer 403 is formed, first electrical interconnections and second electrical interconnections are formed in the material sealing layer 403, the first electrical interconnections are electrically connected to the first contact pads 413, and the second electrical interconnections are electrically connected to the second contact pads 423. The forming steps of the first electrical interconnections and the second electrical interconnections are illustrated hereinafter.

Figure 11:
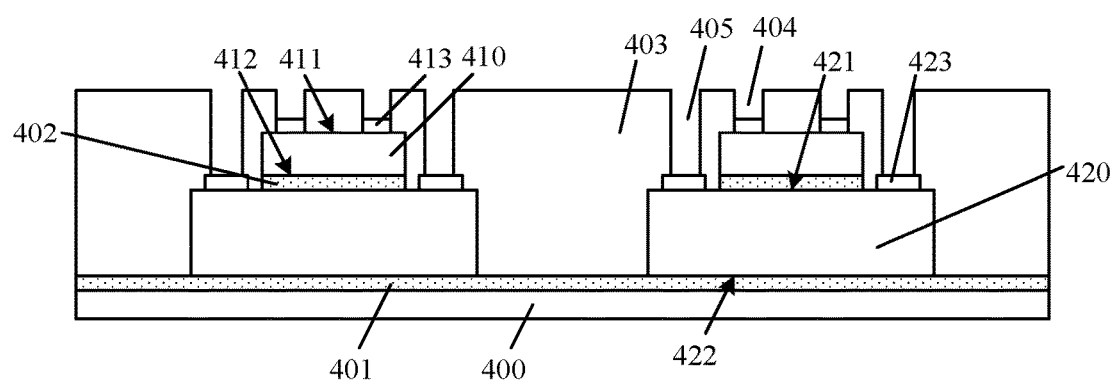

Reference is made to FIG. 11, multiple first openings 404 through which multiple first contact pads 413 are exposed respectively are formed in the material sealing layer 403; and multiple second openings 405 through which multiple second contact pads 423 are exposed respectively are formed in the material sealing layer 403.

The first openings 404 are configured to form the first electrical interconnections, the second openings 405 are configured to form the second electrical interconnections; the first electrical interconnections are configured to electrically connect to the first contact pads 413, and the second electrical interconnections are configured to electrically connect to the second contact pads 423. In the embodiment, the first openings 405 and the second openings 406 are formed simultaneously. In other embodiment, the first openings 404 and the second openings 405 may be formed in different steps. A depth of the first opening 404 is less than a depth of the second opening 405, therefore an etching depth for forming the first opening 404 is less than an etching depth for forming the second opening 405 in a case that the first openings 404 and the second openings 405 are formed adopting the etching process. The first openings 404 and the second openings 405 are formed respectively, so that damage to the first contact pad 413 can be reduced.

In an embodiment, the material sealing layer 403 may be a photosensitive dry film, and the first openings 404 and the second openings 405 may be formed by a photolithography process. The process includes: irradiating, with ultraviolet light, a region in the photosensitive dry film other than a region where the first openings 404 and the second openings 405 are to be formed, so that materials of the photosensitive dry film generate a polymerization reaction to form stable substance; and removing, by a developing process, regions in the photosensitive dry film which are not irradiated by the ultraviolet light to form the first openings 404 and the second openings 405.

In an embodiment, the material sealing layer 403 may be a non-photosensitive dry film or a plastic packaging material, and the first openings 404 and the second openings 405 may be formed by a laser drilling process. The process includes: heating, with a laser source, regions in the material sealing layer 403 where the first openings 404 and the second openings 405 are to be formed, so that the regions irradiated by the laser in the material sealing layer 403 are gasified so as to form the first openings 404 and the second openings 405. A laser pulse outputted by the laser source may have a width of 1 ns-200 ns, a pulse frequency may be 80 kHz-200 kHz, and energy of the laser at a focus point is greater than $1E18$ $W/cm^2$. Since no mask layer is to be formed in the laser drilling process, the process can be simplified and pollution and by-products are reduced.

In a case that the material sealing layer 403 is the non-photosensitive dry film or the plastic packaging material, the first openings 404 and the second openings 405 may also be formed by an etching process. The process of forming the first openings 404 and the second openings 405 may include: forming a patterned layer on a surface of the material sealing layer 403, where regions where the first openings 404 and the second openings 405 are to be formed are exposed through the patterned layer; etching the material sealing layer 403 by using the patterned layer as a mask, until the first contact pad 413 and the second contact pad 423 are exposed, to form the first openings 404 and the second openings 405; and removing the patterned layer after the material sealing layer 403 is etched.

The patterned layer may be a patterned photoresist layer or a patterned hard mask. Materials of the hard mask include one or more of silicon oxide, silicon nitride and silicon oxynitride. The process of etching the material sealing layer 403 may be an anisotropic dry etching process. In the embodiment, the first electrical interconnections and the second electrical interconnections formed subsequently may be conductive plugs, and sidewalls of the first openings 404 and the second openings 405 are perpendicular to the surface of the substrate holder 400. For the anisotropic dry etching process, etching gases may include one or more of $CH_4$, $CHF_3$, $CH_3F$, a bias power is greater than 100 W, and a bias voltage is greater than 10V.

In the embodiment, the sidewalls of the first openings 404 and the second openings 405 are perpendicular to the surface of the substrate holder 400. In another embodiment, the sidewalls of the first openings 404 and the second openings 405 are inclined relative to the surface of the substrate holder 400, and top sizes of the first openings 404 and the second openings 405 are greater than corresponding bottom sizes, thereby being beneficial to form conductive materials in the first openings 404 and the second openings 405 subsequently.

Figure 12:
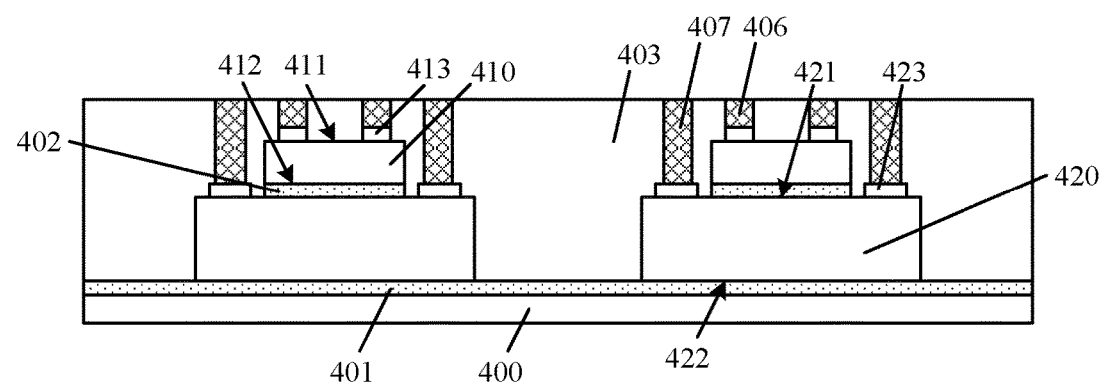

Reference is made to FIG. 12, a first conductive plug 406 filling fully the first opening 404 (as shown in FIG. 11) is formed in the first opening 404; and a second conductive plug 407 filling fully the second opening 405 (as shown in FIG. 11) is formed in the second opening 405.

The first conductive plug 406 is configured to electrically connect to the first chip 410 through the first contact pad 413; and the second conductive plug 407 is configured to electrically connect to the second chip 420 through the second contact pad 423. In the embodiment, the first conductive plug 407 and the second conductive plug 406 are formed simultaneously, so that not only the process steps can be simplified but also the process difficulty can be reduced, thereby avoiding the occurrence of the alignment deviation.

The steps of forming the first conductive plug 406 and the second conductive plug 407 include: forming conductive films in the first openings 404 and the second openings 405, where the conductive films fill fully the first openings 404 and the second openings 405; and polishing the conductive films to form the first conductive plug 406 and the second conductive plug 407. In the embodiment, the polishing process is performed until the surface of the material sealing layer 403 is exposed. In another embodiment, the conductive film with a part of thickness on the surface of the material sealing layer 403 is retained by the polishing process, and the conductive film located on the surface of the material sealing layer 403 is a patterned electrical interconnection layer.

The forming process of the conductive film may be a physical vapor deposition process, such as a sputtering process or a vacuum tin printing process. A material of the conductive film is metal, and the metal includes one or a combination of two or more of gold, tin, copper, tungsten, aluminum and titanium.

Figure 13:
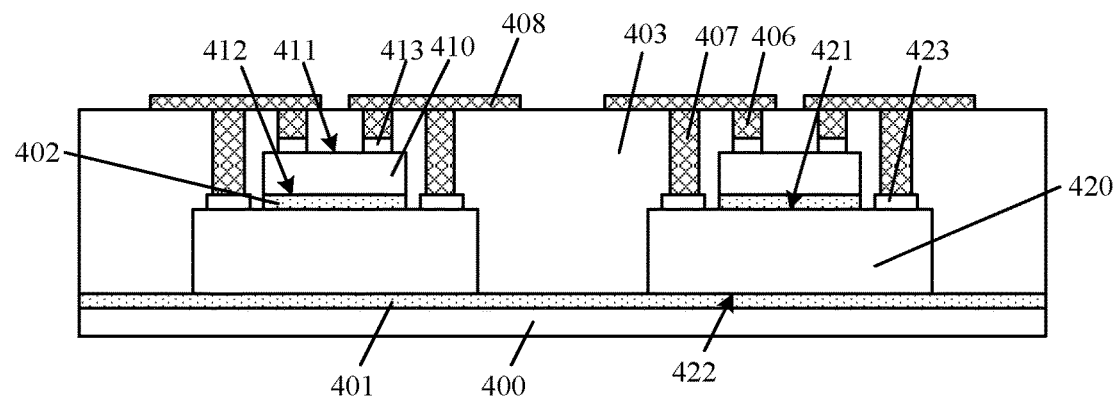

Reference is made to FIG. 13, and an electrical interconnection layer 408 is formed on a part of the surface of the material sealing layer 403, a top surface of the first conductive plug 406 and a top surface of the second conductive plug 407.

The electrical interconnection layer 408 is electrically connected to the first conductive plug 406 or the second conductive plug 407, and is configured to realize rewiring on the surface of the plastic package layer 403.

The forming steps of the electrical interconnection layer 408 include: forming an electrical interconnection film on top surfaces of the material sealing layer 403, the first conductive plug 406 and the second conductive plug 407; forming a patterned layer on a surface of the electrical interconnection film, where a part of the electrical interconnection film is exposed through the patterned layer; etching the electrical interconnection film by using the patterned layer as a mask, until the surface of the material sealing layer 403 is exposed, to form the electrical interconnection layer 408; and removing the patterned layer after the electrical interconnection film is etched.

Materials of the electrical interconnection film include one or more of copper, tungsten, aluminum, titanium, tantalum, titanium nitride, tantalum nitride and silver. The process for etching the electrical interconnection film includes the anisotropic dry etching process or a wet process. The patterned layer may be a patterned photoresist layer or a patterned hard mask. Materials of the hard mask include one or more of silicon oxide, silicon nitride and silicon oxynitride.

Figure 14:
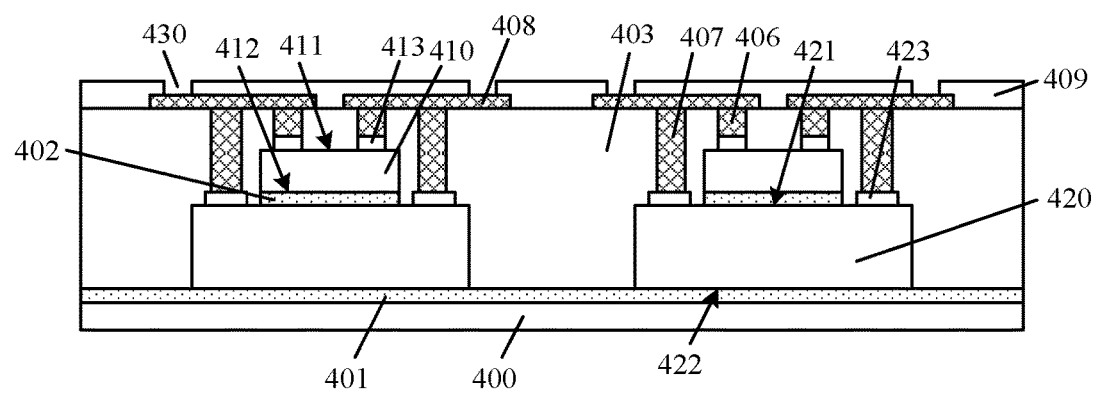

Reference is made to FIG. 14, and a solder resist layer 409 is formed on the surfaces of the material sealing layer 403 and the electrical interconnection layer 408. The solder resist layer 409 has multiple third openings 430 through which a part of the surface of the electrical interconnection layer 408 is exposed.

The solder resist layer 409 is configured to protect the electrical interconnection layer 408; and the third openings 430 in the solder resist layer 409 are configured to form bumps in subsequent processes.

The forming steps of the solder resist layer 409 include: forming a solder resist film on the surfaces of the material sealing layer 403 and the electrical interconnection layer 408; and patterning the solder resist film to form the solder resist layer 409, where the solder resist layer 409 has third openings 430.

In an embodiment, materials of the solder resist layer 409 include polymeric materials or inorganic insulating materials. The polymeric materials may be an insulating resin. The inorganic insulating materials include silicon oxide, silicon nitride or silicon oxynitride. The process of patterning the solder resist film includes: forming a patterned photoresist layer on the surface of the solder resist film; and etching the solder resist film using the photoresist layer.

In another embodiment, the materials of the solder resist layer 409 may be photoresist, and the third openings 430 may be formed by adopting the photolithography process.

Figure 15:
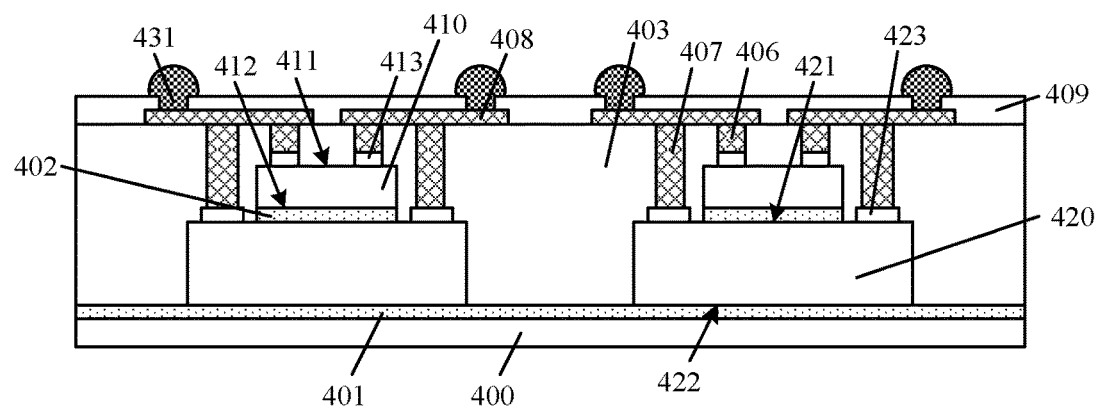

Reference is made to FIG. 15, and a bump 431 is formed in the third opening 430 (as shown in FIG. 14).

In an embodiment, the bump 431 may be a solder ball, and a material of the solder ball includes tin. Forming steps of the solder ball includes: printing solder paste on the surface of the electrical interconnection layer 408 at the bottom of the third openings 430; and reflowing at a high temperature to form the solder ball under the action of surface tension. In another embodiment, soldering flux and solder ball particles are printed on the surface of the electrical interconnection layer 408 at the bottom of the third openings 430, and then reflowing is performed at a high temperature to form the solder ball. In other embodiment, a tin column may be electroplated on the electrical interconnection layer 408, and then reflowing is performed at a high temperature to form the solder ball.

In another embodiment, the bump 431 may be a copper column, a gold column, a solder ball or a combination of the copper column and the solder ball and the like.

Figure 16:
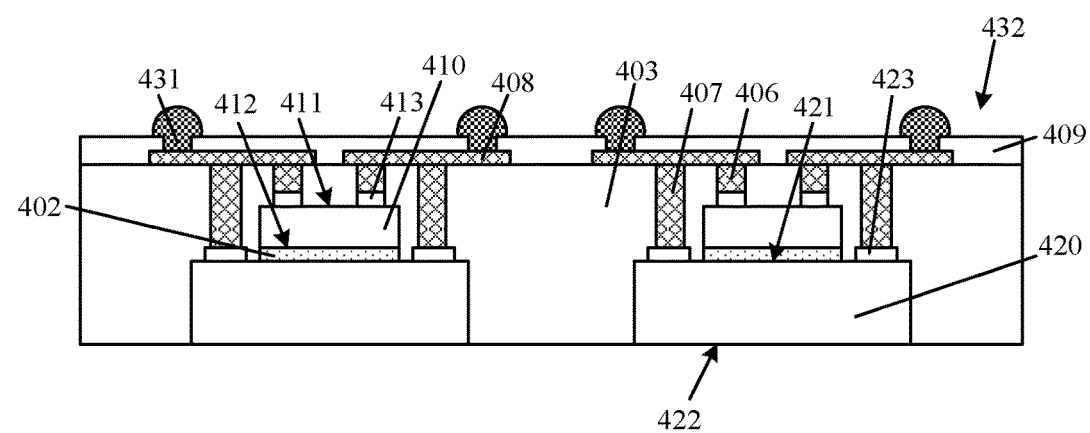

Reference is made to FIG. 16, and the substrate holder 400 (as shown in FIG. 15) is removed to form a substrate 432 to be processed after the bump 431 is formed.

The formed substrate 432 to be processed includes the first chip 410, the second chip 420, the first electrical interconnections, the material sealing layer 403, the first conductive plug 406 and the second conductive plug 407.

In the embodiment, there is a bonding layer 401 between the substrate holder 400, and the material sealing layer 403 and the second chip 420. A material of the bonding layer 401 may be a UV glue, and viscosity of the UV glue is reduced after the UV glue is irradiated by the ultraviolet light so as to peel the substrate holder 400 from the packaging structure subsequently.

Figure 17:
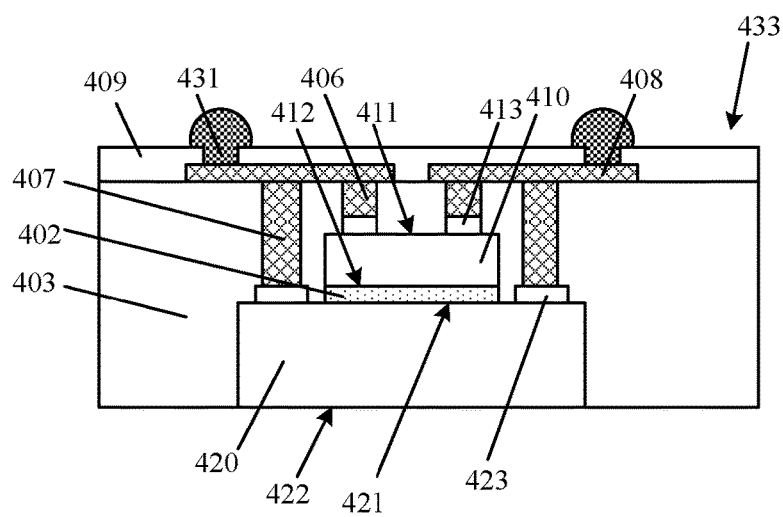

Reference is made to FIG. 17, and the substrate 432 to be processed is cut to form multiple independent packaging structures 433. The packaging structures 433 include the first chip 410 and the second chip 420 bonded with each other, and the material sealing layer 403 cladding the first chip 410 and the second chip 420.

In the embodiment, there are cutting regions between the device regions 440 (as shown in FIG. 8) of the substrate holder 400 (as shown in FIG. 16). The process of cutting the substrate 432 to be processed includes: cutting the substrate 432 to be processed in the regions corresponding to the device regions 440, to form the multiple independent chip packaging structures.

In summary, in the embodiment, the first chip and the second chip are provided, and the area of the first chip is less than the area of the second chip. There are the second contact pads on the third surface of the second chip and there are the first contact pads on the first surface of the first chip; the fourth surface of the second chip is bonded with the surface of the substrate holder, so that the first boding pads can be exposed; the second surface of the first chip is bonded with the third surface of the second chip and the multiple second contact pads are located outside the region where the first chip and the second chip are bonded, so that both the first contact pad and the second contact pad can be exposed. Therefore, the material sealing layer cladding both the first chip and the second chip can be formed on the substrate holder directly.

Firstly, the fourth surface of the second chip is bonded with the surface of the substrate holder and the second surface of the first chip is bonded with the third surface of the second chip, so that the first chip and the second chip are bonded with each other more stably, and a distance between the first chip and the second chip is decreased, thereby being beneficial to shrink a size of the packaging structure.

Secondly, since the material sealing layer clads both the first chip and the second chip, the thickness requirement for the first chip or the second chip is reduced, the thickness of the first chip or the second chip can be decreased, thereby being beneficial to decrease a total thickness of the first chip and the second chip, and reducing a size of the formed packaging structure. Besides, the stability of the material sealing layer is better, thereby solving the cracking or peeling problem caused in a case of forming a multilayer material sealing layer.

Lastly, after the material sealing layer is formed, the first electrical interconnections electrically connected to the first contact pads and the second electrical interconnections electrically connected to the second contact pads are formed. The process steps of forming a multilayer electrical interconnections by multiple times are avoided, so that the forming process of the first electrical interconnections and the second electrical interconnections is simplified, and an alignment deviation problem generated during the process of forming the multilayer electrical interconnections is solved. And, since the thickness requirement for the first chip and the second chip is reduced, a distance from the plastic packaging layer to the second contact pad is decreased by decreasing the thickness of the first chip, so that difficulty of the process for forming the second electrical interconnections is reduced, and it is beneficial to reduce a possibility that an open circuit occurs between the second electrical interconnections and the second contact pads, and between the first electrical interconnections and the first contact pads, thereby improving a yield of the formed packaging structure.

Accordingly, a chip packaging structure formed by adopting the above packaging method is further provided according to the present disclosure. Reference is made to FIG. 15 continuously, and the packaging structure includes:

a first chip 410, where the first chip 410 includes a first surface 411 and a second surface 412 opposite to each other, and there are multiple first contact pads 413 on the first surface 411 of the first chip 410;

a second chip 420, where the second chip 420 includes a third surface 421 and a fourth surface 422 opposite to each other, there are multiple second contact pads 423 on the third surface 421 of the second chip 420, and an area of the second chip 420 is greater than an area of the first chip 410;

a substrate holder 400, where the fourth surface 422 of the second chip 420 is bonded with a surface of the substrate holder 400 through a bonding layer 401, and where the second surface 412 of the first chip 410 is bonded with the third surface 421 of the second chip 420, and the multiple second contact pads 423 are located outside a region where the first chip 410 and the second chip 420 are bonded;

a material sealing layer 403 located on the surface of the substrate holder 400, where the material sealing layer 403 clads the first chip 410 and the second chip 420; and first electrical interconnections and second electrical interconnections located in the material sealing layer 403, where the first electrical interconnections are electrically connected to the first contact pads 413, and the second electrical interconnections are electrically connected to the second contact pads 423.

The above structure is illustrated in detail hereinafter.

The first electrical interconnections and the second electrical interconnections in the embodiment include: multiple first openings through which multiple first contact pads 413 are exposed respectively and multiple second openings through which multiple second contact pads 423 are exposed respectively in the material sealing layer 403; a first conductive plug 406 filling fully the first opening and located in the first opening; and a second conductive plug 407 filling fully the second opening and located in the second opening.

The packaging structure according to the embodiment further includes: an electrical interconnection layer 408 located on a part of a surface of the material sealing layer 403, a top surface of the first conductive plug 406 and a top surface of the second conductive plug 407.

The packaging structure according to the embodiment further includes: a solder resist layer 409 located on surfaces of the material sealing layer 403 and the electrical interconnection layer 408, where the solder resist layer 409 has multiple third openings through which a part of the surface of the electrical interconnection layer 408 is exposed; and bumps 431 located in the third openings.

In the embodiment, the number of the first chips 410 is one. In another embodiment, the number of the first chips is more than one. In a case that the number of the first chips is more than one, functions of the multiple first chips are same or different. In a case that the number of the first chips is more than one, the multiple first chips are located in a same layer or form a multilayer overlapping structure. In a case that the first chips form the multilayer overlapping structure, a part of first contact pads of the first chip in at least one layer are located outside a region where first chips in two adjacent layers are bonded.

It should be noted that, in the embodiment and the accompanying drawing, only one first chip 410 and one second chip 420 are taken as examples to describe the chip packaging method and the chip packaging structure in the present disclosure. In other embodiment, the number of the first chips 410 may be one or more, and the number of the second chips 420 may also be one or more. In a case that the number of the first chips or the second chips is more than one, the multiple first chips 410 or the multiple second chips 420 are chips with the same function or different functions, such as a memory chip, a processor chip, an image sensor chip or a motion sensor chip and the like. In a case that the number of the first chips 410 is more than one, multiple first chips 410 may be distributed on the third surface 421 of one second chip 420.

A packaging structure is further provided according to the embodiment. Based on FIG. 15, the process further includes: removing the substrate holder 400 to form a substrate to be processed; and cutting the substrate to be processed to form multiple independent packaging structures 433, as shown in FIG. 17. The packaging structure 433 includes the first chip 410 and the second chip 420 bonded with each other, and the material sealing layer 403 cladding the first chip 410 and the second chip 420.

In summary, in the embodiment, there are the second contact pads on the third surface of the second chip and there are the first contact pads on the first surface of the first chip; the fourth surface of the second chip is bonded with the surface of the substrate holder, the second surface of the first chip is bonded with the third surface of the second chip, and the multiple second contact pads are located outside the region where the first chip and the second chip are bonded, so that both the first contact pad and the second contact pad can be exposed. Therefore, the material sealing layer can clad the first chip and the second chip directly. Firstly, the first chip and the second chip are bonded with each other more stably, a distance between the first chip and the second chip is decreased, and it is beneficial to shrink the size of the packaging structure. Secondly, the material sealing layer clads both the first chip and the second chip, the thickness requirement for the first chip or the second chip is reduced, the thickness of the first chip or the second chip can be decreased; furthermore, the stability of the material sealing layer is better, and the cracking or peeling problem caused in a case of forming the multilayer material sealing layer can be solved. Lastly, the material sealing layer has the first electrical interconnections electrically connected to the first contact pads and the second electrical interconnections electrically connected to the second contact pads, the alignment deviation problem of the multilayer electrical interconnections is solved, thereby being beneficial to decrease a possibility of an open circuit, and improving a yield of the packaging structure.

Figure 18:
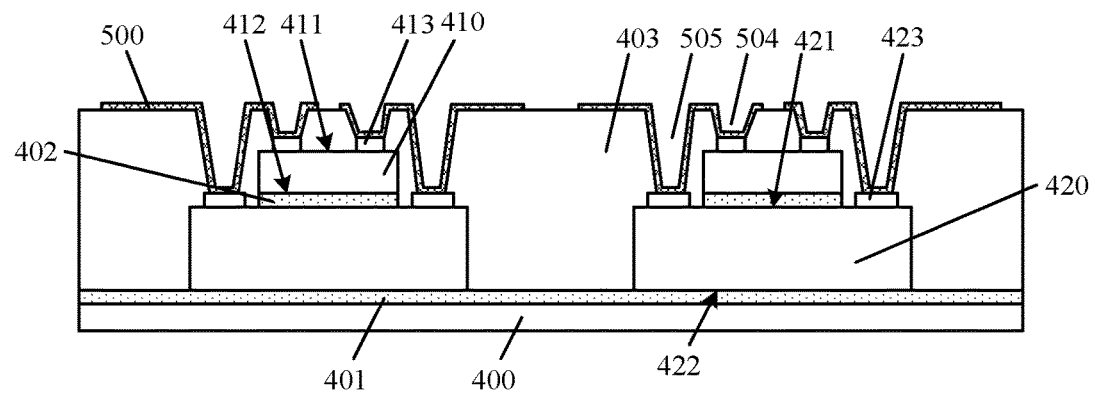
FIGS. 18 to 19 are schematic cross-section structural diagrams of another chip package process according to an embodiment of the present disclosure.
Figure 19:
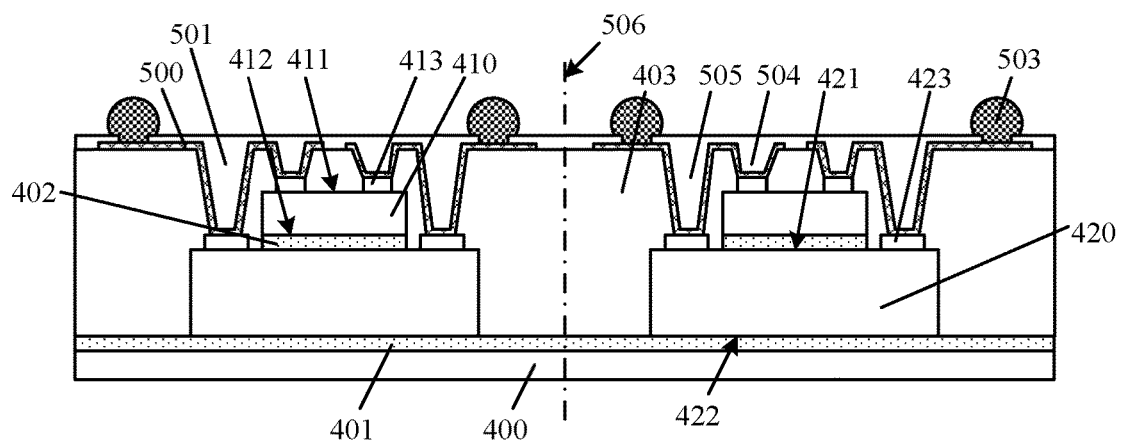

FIGS. 18 to 19 are schematic cross-section structural diagrams of another chip packaging process according to embodiments of the present disclosure.

Based on FIG. 10, reference is made to FIG. 18 continuously, multiple first openings 504 through which multiple first contact pads 413 are exposed respectively are formed in the material sealing layer 403; multiple second openings 505 through which multiple second contact pads 423 are exposed respectively are formed in the material sealing layer 403; an electrical interconnection layer 500 is formed on sidewalls and bottom surfaces of the first openings 504, sidewalls and bottom surfaces of the second openings 505 and a part of a top surface of the material sealing layer 403; first electrical interconnections are formed in the first openings 504; and second electrical interconnections are formed in the second openings 505.

In the embodiment, forming steps of the first electrical interconnections and the second electrical interconnections further include: forming the electrical interconnection layer 500 on sidewalls and bottom surfaces of the first openings 504, sidewalls and bottom surfaces of the second openings 505 and a part of the top surface of the material sealing layer 403; forming the first electrical interconnections in the first openings 504; and forming the second electrical interconnections in the second openings 505.

In the embodiment, the sidewalls of the first openings 504 and the second openings 505 are inclined relative to the surface of the substrate holder 400, and top sizes of the first opening 504 and the second opening 505 are greater than corresponding bottom sizes, thereby being beneficial to form a patterned electrical interconnection layer 500 on the sidewalls and the top surfaces of the first openings 504 and the second openings 505. Forming steps of the first openings 504 and the second openings 505 are the same as that described in the above embodiment, which is not repeated here.

Forming steps of the electrical interconnection layer include: forming an electrical interconnection film on the surface of the material sealing layer 403, the sidewalls and bottom surfaces of the first openings 504 and the sidewalls and bottom surfaces of the second openings 505; forming a patterned layer on a surface of the electrical interconnection film, where a part of the electrical interconnection film is exposed through the patterned layer; and etching the electrical interconnection film by using the patterned layer as a mask until the surface of the material sealing layer 403 is exposed.

The forming process of the electrical interconnection film may be a physical vapor deposition process, such as a sputtering process. Materials of the electrical interconnection layer 500 include one or a combination of two or more of gold, tin, copper, tungsten, aluminum and titanium. The patterned layer may be a patterned photoresist layer or a patterned hard mask layer.

Reference is made to FIG. 19, a solder resist layer 501 is formed on the surfaces of the material sealing layer 403 and the electrical interconnection layer 500. The solder resist layer 501 has multiple third openings through which a part of the electrical interconnection layer 500 located on the surface of the material sealing layer 403. Bumps 503 are formed in the third openings.

In the embodiment, the solder resist layer 501 may fill fully the first openings 504 (as shown in FIG. 18) and the second openings 505 (as shown in FIG. 18).

Forming steps of the solder resist layer 501 and the bump 503 are the same as that in the embodiment described above, which are not repeated here.

After the bump 503 is formed, the substrate holder 400 is removed to form a substrate to be processed; and the substrate to be processed is cut along a cutting line 506 to form multiple independent packaging structures. The packaging structures include the first chip 410 and the second chip 420 bonded with each other, and the material sealing layer 403 cladding the first chip 410 and the second chip 420.

Accordingly, a chip packaging structure formed by adopting the packaging method described above is further provided according to the present disclosure. Reference is made to FIG. 19 continuously, the packaging structure includes:

a first chip 410, where the first chip 410 includes a first surface 411 and a second surface 412 opposite to each other, and there are multiple first contact pads 413 on the first surface 411 of the first chip 410;

a second chip 420, where the second chip 420 includes a third surface 421 and a fourth surface 422 opposite to each other, there are multiple second contact pads 423 on the third surface 421 of the second chip 420, and an area of the second chip 420 is greater than an area of the first chip 410;

a substrate holder 400, where the fourth surface 422 of the second chip 420 is bonded with a surface of the substrate holder 400, and where the second surface 412 of the first chip 410 is bonded with the third surface 421 of the second chip 420, and the multiple second contact pads 423 are located outside a region where the first chip 410 and the second chip 420 are bonded;

a material sealing layer 403 located on the surface of the substrate holder 400, where the material sealing layer 403 clads the first chip 410 and the second chip 420; and first electrical interconnections and second electrical interconnections located in the material sealing layer 403, where the first electrical interconnections are electrically connected to the first contact pads 413, and the second electrical interconnections are electrically connected to the second contact pads 423.

As compared with the packaging structure provided in the above embodiments, the packaging structure in the embodiment differs in that, the first electrical interconnections and the second electrical interconnections include: multiple first openings through which multiple first contact pads 413 are exposed respectively located in the material sealing layer 403; multiple second openings through which multiple second contact pads 423 are exposed respectively located in the material sealing layer 403; the electrical interconnection layer 500 located on sidewalls and bottom surfaces of the first openings, sidewalls and bottom surfaces of the second openings and a part of the top surface of the material sealing layer 403; the first electrical interconnection includes the electrical interconnection layer 500 located in the first openings; and the second interconnection includes electrical the electrical interconnection layer 500 located in the second openings.

Although the present disclosure is disclosed as above, the present disclosure is not limited thereto. Those skilled in the art may make various modifications and changes without departing from the spirit and the scope of the present disclosure. Therefore, the protection scope of the present disclosure should be defined by the appended claims.

The invention claimed is:

1. A chip packaging method, comprising:
providing a first chip, wherein the first chip comprises a first surface and a second surface opposite to each other, and there are a plurality of first contact pads on the first surface of the first chip;
providing a second chip, wherein the second chip comprises a third surface and a fourth surface opposite to each other, there are a plurality of second contact pads on the third surface of the second chip, and an area of the second chip is greater than an area of the first chip;
providing a substrate holder;
bonding the fourth surface of the second chip with a surface of the substrate holder;
bonding the second surface of the first chip with the third surface of the second chip, wherein the plurality of second contact pads are located outside a region where the first chip and the second chip are bonded;
forming a material sealing layer on the surface of the substrate holder, wherein the material sealing layer clads the first chip and the second chip; and
forming first electrical interconnections and second electrical interconnections in the material sealing layer, wherein the first electrical interconnections are electrically connected to the first contact pads, and the second electrical interconnections are electrically connected to the second contact pads; and wherein the chip packaging method further comprises:
forming a plurality of first openings through which a plurality of first contact pads are exposed respectively in the material sealing layer; and forming a plurality of second openings through which a plurality of second contact pads are exposed respectively in the material sealing layer.

2. The chip packaging method according to claim 1, wherein the bonding the fourth surface of the second chip with the surface of the substrate holder comprises: forming a bonding layer on the surface of the substrate holder; and fixing the fourth surface of the second chip on a surface of the bonding layer.

3. The chip packaging method according to claim 1, wherein the second surface of the first chip is bonded with the third surface of the second chip through an insulating adhesive layer.

4. The chip packaging method according to claim 1, wherein the material sealing layer is a photosensitive dry film, a non-photosensitive dry film or a plastic packaging material film.

5. The chip packaging method according to claim 1, wherein the first electrical interconnections and the second electrical interconnections comprise: electrical interconnection layers located on sidewalls and bottom surfaces of the first openings, sidewalls and bottom surfaces of the second openings and a part of a top surface of the material sealing layer, and the electrical interconnection layers fill fully or do not fill fully the first openings or the second openings.

6. The chip packaging method according to claim 1, wherein the first electrical interconnections and the second electrical interconnections comprise first conductive plugs filling fully the first openings and second conductive plugs filling fully the second openings.

7. The chip packaging method according to claim 6, further comprising:
forming electrical interconnection layers on a part of a surface of the material sealing layer, top surfaces of the first conductive plugs and top surfaces of the second conductive plugs, wherein the electrical interconnection layers are electrically connected to the first conductive plugs or the second conductive plugs.

8. The chip packaging method according to claim 5, further comprising:
forming solder masks on surfaces of the material sealing layer and the electrical interconnection layers, wherein the solder masks have a plurality of third openings through which a part of the surfaces of the electrical interconnection layers are exposed; and forming bumps in the third openings.

9. The chip packaging method according to claim 1, wherein the number of the first chip is one or more; and the number of the second chip is one or more.

10. The chip packaging method according to claim 9, wherein in a case that the number of the first chip is more than one, a plurality of first chips are located in a same layer or located on a plurality of overlapping layers, and the plurality of first chips are distributed on one or more of the second chip; and in a case that the number of the first chip or the second chip is more than one, functions of a plurality of first chips or a plurality of second chips are same or different.

11. A chip packaging method, comprising:
providing a first chip, wherein the first chip comprises a first surface and a second surface opposite to each other, and there are a plurality of first contact pads on the first surface of the first chip;
providing a second chip, wherein the second chip comprises a third surface and a fourth surface opposite to each other, there are a plurality of second contact pads on the third surface of the second chip, and an area of the second chip is greater than an area of the first chip;
providing a substrate holder;
bonding the fourth surface of the second chip with a surface of the substrate holder;
bonding the second surface of the first chip with the third surface of the second chip, wherein the plurality of second contact pads are located outside a region where the first chip and the second chip are bonded;
forming a material sealing layer on the surface of the substrate holder, wherein the material sealing layer clads the first chip and the second chip; and
forming first electrical interconnections and second electrical interconnections in the material sealing layer, wherein the first electrical interconnections are electrically connected to the first contact pads, and the second electrical interconnections are electrically connected to the second contact pads;
wherein after the forming the material sealing layer, the method further comprises: removing the substrate holder to form a substrate to be processed; and cutting the substrate to be processed to form a plurality of independent packaging structures.

12. A chip packaging structure, comprising:
a first chip, wherein the first chip comprises a first surface and a second surface opposite to each other, and there are a plurality of first contact pads on the first surface of the first chip;
a second chip, wherein the second chip comprises a third surface and a fourth surface opposite to each other, there are a plurality of second contact pads on the third surface of the second chip, and an area of the second chip is greater than an area of the first chip;
a substrate holder, wherein the fourth surface of the second chip is bonded with a surface of the substrate holder, and wherein the second surface of the first chip is bonded with the third surface of the second chip, and the plurality of second contact pads are located outside a region where the first chip and the second chip are bonded;
a material sealing layer located on the surface of the substrate holder, wherein the material sealing layer clads the first chip and the second chip; and
first electrical interconnections and second electrically interconnections located in the material sealing layer, wherein the first electrical interconnections are electrically connected to the first contact pads, and the second electrical interconnections are electrically connected to the second contact pads;
wherein the first electrical interconnections are located in first openings of the material sealing layer and the second electrical interconnections are located in second openings of the material sealing layer; and
the first electrical interconnections and the second electrical interconnections comprise electrical interconnection layers located on sidewalls and bottom surfaces of the first openings, sidewalls and bottom surfaces of the second openings and a part of a top surface of the material sealing layer and the electrical interconnection layers fill fully or do not fill fully the first openings or the second openings, or the first electrical interconnections and the second electrical interconnections comprise first conductive plugs filling fully the first openings and second conductive plugs filling fully the second openings.

13. The chip packaging structure according to claim 12, further comprising:
electrical interconnection layers distributed on a part of a surface of the material sealing layer, top surfaces of the first conductive plugs and top surfaces of the second conductive plugs, wherein the electrical interconnection layers are electrically connected to the first conductive plugs or the second conductive plugs.

14. The chip packaging structure according to claim 12, further comprising: solder masks distributed on surfaces of the material sealing layer and the electrical interconnection layers, wherein the solder masks have a plurality of third openings through which a part of the surfaces of the electrical interconnection layers are exposed; and bumps located in the third openings.

15. A chip packaging structure, comprising:
a first chip, wherein the first chip comprises a first surface and a second surface opposite to each other and there are a plurality of first contact pads on the first surface of the first chip;
a second chip, wherein the second chip comprises a third surface and a fourth surface opposite to each other, there are a plurality of second contact pads on the third surface of the second chip, and an area of the second chip is greater than an area of the first chip, and wherein the second surface of the first chip is bonded with the third surface of the second chip, and the plurality of second contact pads are located outside a region where the first chip and the second chip are bonded;
a material sealing layer located on the surface of the substrate holder, wherein the material sealing layer clads the first chip and the second chip; and
first electrical interconnections and second electrical interconnections located in the material sealing layer, wherein the first electrical interconnections are electrically connected to the first contact pads, and the second electrical interconnections are electrically connected to the second contact pads;
wherein the first electrical interconnections are located in first openings of the material sealing layer and the second electrical interconnections are located in second openings of the material sealing layer; and
the first electrical interconnections and the second electrical interconnections comprise electrical interconnection layers located on sidewalls and bottom surfaces of the first openings, sidewalls and bottom surfaces of the second openings and a part of a top surface of the material sealing layer and the electrical interconnection lavers fill fully or do not fill fully the first openings or the second openings, or the first electrical interconnections and the second electrical interconnections comprise first conductive plugs filling fully the first openings and second conductive plugs filling fully the second openings.

16. The chip packaging structure according to claim 15, further comprising:
electrical interconnection layers distributed on a part of a surface of the material sealing layer, top surfaces of the first conductive plugs and top surfaces of the second conductive plugs, wherein the electrical interconnection layers are electrically connected to the first conductive plugs or the second conductive plugs.

17. The chip packaging structure according to claim 15, further comprising: solder masks distributed on surfaces of the material sealing layer and the electrical interconnection layers, wherein the solder masks have a plurality of third openings through which a part of the surfaces of the electrical interconnection layers are exposed; and bumps distributed in the third openings.

* * * * *

UNITED STATES PATENT AND TRADEMARK OFFICE
CERTIFICATE OF CORRECTION

PATENT NO. : 10,276,540 B2
APPLICATION NO. : 15/558341
DATED : April 30, 2019
INVENTOR(S) : Zhiqi Wang et al.

Page 1 of 1

It is certified that error appears in the above-identified patent and that said Letters Patent is hereby corrected as shown below:

In the Claims

At Column 24, Claim 15, Line 16, replace "lavers" with --layers--.

Signed and Sealed this
Second Day of July, 2019

Andrei Iancu
*Director of the United States Patent and Trademark Office*